(12) United States Patent
Nienhuys et al.

(10) Patent No.: US 8,970,818 B2
(45) Date of Patent: Mar. 3, 2015

(54) LITHOGRAPHIC APPARATUS AND COMPONENT WITH REPEATING STRUCTURE HAVING INCREASED THERMAL ACCOMMODATION COEFFICIENT

(75) Inventors: Han-Kwang Nienhuys, Utrecht (NL); Franciscus Johannes Joseph Janssen, Geldrop (NL); Sven Pekelder, Breugel (NL); Roger Wilhelmus Antonius Henricus Schmitz, Helmond (NL); Alexander Marinus Arnoldus Huijberts, Veghel (NL); Paulus Albertus Maria Gasseling, Steensel (NL)

(73) Assignee: ASML Netherlands B.V., Veldhoven (NL)

( * ) Notice: Subject to any disclaimer, the term of this patent is extended or adjusted under 35 U.S.C. 154(b) by 359 days.

(21) Appl. No.: 13/478,888

(22) Filed: May 23, 2012

(65) Prior Publication Data

US 2012/0300187 A1    Nov. 29, 2012

Related U.S. Application Data

(60) Provisional application No. 61/489,539, filed on May 24, 2011.

(51) Int. Cl.
*G03B 27/52* (2006.01)
*G03F 7/20* (2006.01)

(52) U.S. Cl.
CPC .................................. *G03F 7/70883* (2013.01)

USPC ............................................................ 355/30

(58) Field of Classification Search
CPC .................................................... G03F 7/70883
USPC ............................................................ 355/30
See application file for complete search history.

(56) References Cited

U.S. PATENT DOCUMENTS

| 2005/0122503 | A1* | 6/2005 | Ottens et al. | 355/72 |
| 2006/0176454 | A1* | 8/2006 | Ohmi et al. | 355/53 |
| 2007/0242248 | A1* | 10/2007 | Nakano et al. | 355/53 |
| 2010/0033704 | A1* | 2/2010 | Shiraishi | 355/71 |

OTHER PUBLICATIONS

Brown et al., "The physical and chemical properties of electroless nickel—phosphorus alloys and low reflectance nickel—phosphorus black surfaces", Journal of Materials Chemistry, 2002, 12, pp. 2749-2754.
Song et al., "Correlation of Thermal Accommodation Coefficient for 'Engineering' Surfaces", American Society of Mechanical Engineers, 1987, pp. 107-115.

* cited by examiner

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus includes a substrate table constructed to hold a substrate, and a projection system configured to project a patterned radiation beam onto a target portion of the substrate. A surface of a component of the lithographic apparatus that is in a vacuum environment in use is provided with a repeating structure configured to increase the effective thermal accommodation coefficient of the surface.

19 Claims, 7 Drawing Sheets

LITHOGRAPHIC APPARATUS AND COMPONENT WITH REPEATING STRUCTURE HAVING INCREASED THERMAL ACCOMMODATION COEFFICIENT

CROSS-REFERENCE TO RELATED APPLICATIONS

This application claims the benefit of priority from U.S. Provisional Patent Application No. 61/489,539, filed May 24, 2011, the content of which is incorporated herein by reference in its entirety.

FIELD

The present invention relates to a lithographic apparatus and to a component of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

It may be desirable to facilitate transfer of heat to components, from components, or between components, of a lithographic apparatus using apparatus which is not known from the prior art.

SUMMARY

According to an aspect of the invention there is provided a lithographic apparatus comprising a substrate table constructed to hold a substrate, and a projection system configured to project a patterned radiation beam onto a target portion of the substrate, wherein a surface of a component of the lithographic apparatus which is in a vacuum environment in use is provided with a repeating structure which is configured to increase the effective thermal accommodation coefficient of the surface.

According to an aspect of the invention there is provided a lithographic apparatus component having a surface provided with a structure which satisfies:

$$\frac{f^{2.04}}{1 + 0.47 \cdot R^{-1.96}} > 0.05$$

wherein f is the fraction of the structure which is occupied by space, and R is the depth of the structure divided by the width of the structure.

The structure may have an aspect ratio in excess of 0.2.

The structure may be a repeating structure.

The structure may be a non-repeating structure, and f and R are may be average values for the structure.

According to an aspect of the invention, there is provided a lithographic apparatus component having a surface provided with a structure, the surface having an effective thermal accommodation coefficient of 0.4 or greater for hydrogen gas.

The structure may be a repeating structure.

According to an aspect of the invention, there is provided a lithographic apparatus component having a surface which has a surface area per unit of projected two-dimensional area which is greater than the surface area per unit of projected two-dimensional area of a conventional surface of the component.

The surface may be provided with a structure. The structure may be a repeating structure.

The repeating structure of any of the aspects of the invention may comprise a series of ridges.

The repeating structure of any of the aspects of the invention may comprise an array of holes provided in the surface of the component.

The array of holes may comprise a honeycomb arrangement or an array of circular holes.

The repeating structure may have a constant pitch.

According to an aspect of the invention, there is provided a lithographic apparatus component having a surface provided with a structure which has a pitch which is less than a mean free path of gas that will be in the vicinity of the structure during operation of a lithographic apparatus.

The lithographic apparatus component may be a projection system wall, a substrate table, a mirror, a heat sink or an internal chamber wall.

According to an aspect of the invention, there is provided a lithographic apparatus comprising a substrate table constructed to hold a substrate, and a projection system configured to project a patterned radiation beam onto a target portion of the substrate, wherein the lithographic apparatus is configured to deliver gas to an opening in the projection system through which the patterned radiation beam may pass onto the target portion of the substrate and through which the gas may travel, and wherein a wall of the projection system located adjacent to a substrate in use has a thermal accommodation coefficient of 0.4 or greater for hydrogen gas.

The wall of the projection system which is adjacent to a substrate in use may have a surface area per unit of projected two-dimensional area which is greater than the surface area per unit of projected two-dimensional area of a conventional projection system wall.

The wall of the projection system which is adjacent to the substrate, in use, may have a roughened surface.

The roughened surface may be formed using one or more of: milling, etching, sanding, sand blasting, abrasive blasting, brushing.

The wall of the projection system located adjacent to the substrate, in use, may be a structured surface. The structured surface may comprise a plurality of ridges which extend towards the substrate table.

The structured surface may be periodic, and the structured surface may have the same pitch across substantially all of the structured surface.

The structured surface may be periodic, and the pitch may become larger as the distance from the structured surface to the opening increases.

The wall of the projection system facing the substrate may be provided with a plurality of baffles which extend towards the substrate table. The baffles may be provided beneath a raised portion of the projection system wall.

A porous coating may be provided on the wall of the projection system located adjacent to the substrate, in use.

A metal layer may be provided on the roughened surface or maybe provided on the porous coating.

The projection system wall may be provided with a layer of 'super black'.

According to an aspect of the invention, there is provided a lithographic apparatus comprising a substrate table constructed to hold a substrate, and a projection system configured to project a patterned radiation beam onto a target portion of the substrate, wherein the lithographic apparatus is configured to deliver gas to an opening in the projection system through which the patterned radiation beam may pass onto the target portion of the substrate and through which the gas may travel, and wherein a wall of the projection system located adjacent to a substrate, in use, has a roughened or structured surface.

According to an aspect of the invention, there is provided a lithographic apparatus comprising a substrate table constructed to hold a substrate, and a projection system configured to project a patterned radiation beam onto a target portion of the substrate, and wherein the lithographic apparatus is configured to deliver gas to an opening in the projection system through which the patterned radiation beam may pass onto the target portion of the substrate and through which the gas may travel, and wherein a wall of the projection system located adjacent to a substrate, in use, is provided with a plurality of baffles which extend towards the substrate table.

According to an aspect of the invention, there is provided a lithographic apparatus comprising a substrate table constructed to hold a substrate, and a projection system configured to project a patterned radiation beam onto a target portion of the substrate, wherein the lithographic apparatus is configured to deliver gas to an opening in the projection system through which the patterned radiation beam may pass onto the target portion of the substrate and through which the gas may travel, and wherein a wall of the projection system located adjacent to a substrate, in use, has a higher thermal accommodation coefficient than the substrate (or the substrate table).

According to an aspect of the invention there is provided a device manufacturing method comprising projecting a patterned beam of radiation through an opening in a projection system onto a substrate, wherein the method comprises delivering gas to the projection system opening via a conduit, wherein a wall of the projection system located adjacent to a substrate, in use, has a higher thermal accommodation coefficient than the substrate.

According to an aspect of the invention, there is provided a lithographic apparatus comprising a substrate table constructed to hold a substrate, and a projection system configured to project a patterned radiation beam onto a target portion of the substrate, and wherein the lithographic apparatus is configured to deliver gas to an opening in the projection system through which the patterned radiation beam may pass onto the target portion of the substrate and through which the gas may travel, the lithographic apparatus further comprising a plate located between the substrate table and a wall of the projection system, the plate defining a gap configured to receive gas after the gas has traveled through the opening. The plate may extend around the projection system opening. Alternatively, the plate may be provided to one side of the projection system opening. The plate may be provided beneath a raised portion of the projection system wall. The plate may extend to an edge of the substrate in use.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
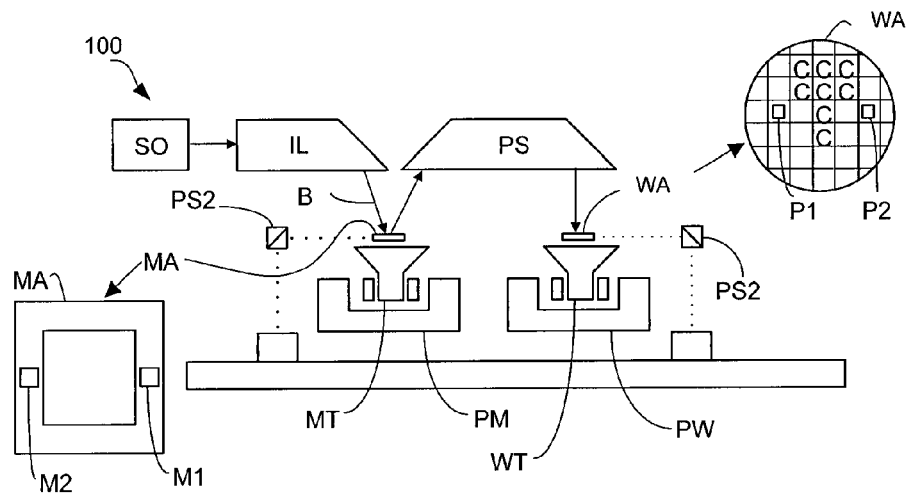
FIG. 1 schematically depicts a lithographic apparatus according to an embodiment of the invention.

FIG. 1 schematically depicts a lithographic apparatus 100 according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) WA and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate WA.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination (e.g. gas-phase organic compounds coming from resist on the substrate WA) reaching optical components of the lithographic apparatus.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate WA. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate WA may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
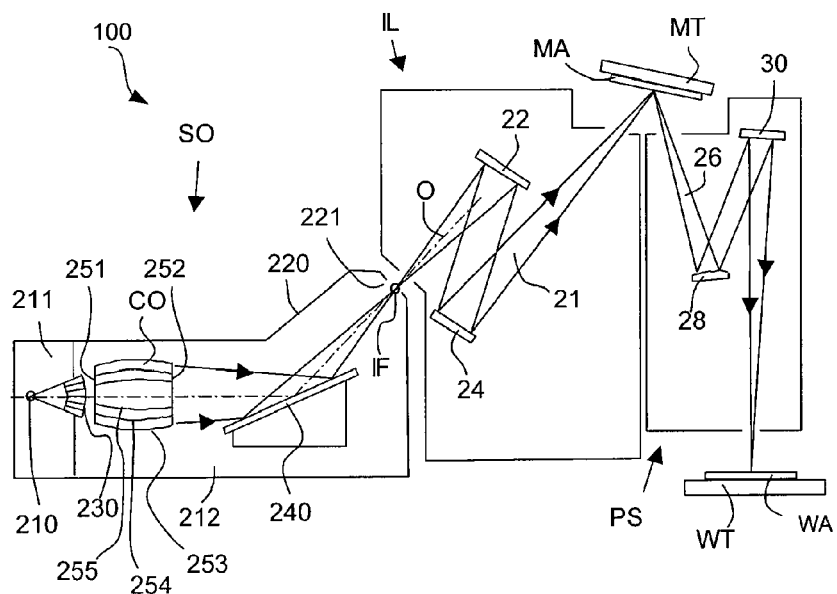
FIG. 2 schematically depicts a more detailed view of the apparatus of FIG. 1, including a discharge produced plasma source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate WA held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
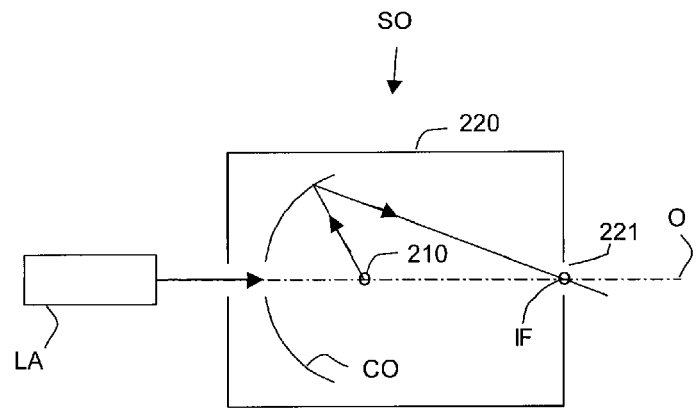
FIG. 3 schematically depicts a view of an alternative source collector module of the apparatus of FIG. 1, the alternative being a laser produced plasma source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
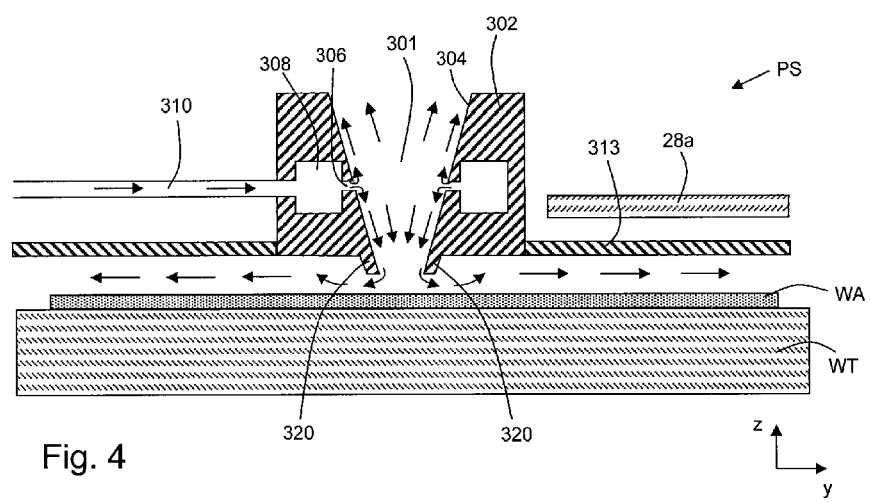
FIG. 4 schematically depicts part of a projection system and a substrate table of the lithographic apparatus according to an embodiment of the invention.

FIG. 4 shows schematically in cross-section a lower portion of the projection system PS. The projection system PS includes an opening 301 formed by a sloped inner surface 304 of a duct-defining wall 302, also referred to hereinafter as the opening defining wall 302. An annular slit 306 formed in the sloped inner surface 304 is configured to deliver gas into the opening 301. An annular chamber 308 is connected to the annular slit 306 and is also connected to a pipe 310. The pipe 310, annular chamber 308 and annular slit 306 may together be considered to form a conduit which delivers gas to the opening 301. The opening 301 is located opposite to the substrate table. The gas which travels from the opening to the substrate serves to reduce the likelihood of contamination reaching optical components of the projection system. The conduit may have any other suitable form. The conduit may for example comprise a plurality of pipes which run adjacent to one another, such that the pipe 310 is one of a plurality of pipes. In this description references to a pipe 310 may be considered to encompass a plurality of pipes.

A mirror 28a located adjacent to a wall 313 of the projection system is shown in FIG. 4. The mirror 28a performs the same function as the mirror 28 shown in FIG. 2, i.e. it is used to reflect radiation from a mask MA (see FIG. 2) to a substrate WA (usually in combination with other mirrors). The position of the mirror 28 in FIG. 2 may be considered to be schematic, and a practical EUV lithographic apparatus is likely to have the mirror 28a close to the substrate table WT as shown in FIG. 4.

The opening defining wall 302 includes a protruding portion 320 which extends towards the substrate table WT. The protruding portion 320 acts to extend the sloped inner surface 304 of the opening 301, thereby improving suppression of the passage of contamination into the projection system PS (the contamination suppression mechanism is described further below). In an embodiment, the protruding portion 320 may be omitted.

In use, a substrate WA supported by a substrate table WT is positioned beneath the projection system PS as shown. EUV radiation is patterned by a mask (not shown in FIG. 4) and is then projected through the opening 301 onto the substrate WA, thereby exposing a pattern onto the substrate. The EUV radiation may be focused as a converging radiation beam such that an outer portion of the EUV radiation beam is substantially parallel to the sloped inner surface 304 of the opening defining wall 302.

It is desirable to reduce the likelihood that contamination (e.g. gas-phase organic compounds coming from resist on the substrate WA) will travel from the substrate WA into the interior of the projection system PS. This is because the contamination may accumulate on optical surfaces such as the mirror 28a and cause the reflectivity of those optical surfaces to be reduced. This will in turn reduce the intensity of EUV radiation available for projection onto the substrate WA, and will therefore reduce the throughput of the lithographic apparatus (i.e. the number of substrates which may be patterned per hour by the lithographic apparatus).

Gas which flows into the opening 301 through the annular slit 306 reduces the likelihood of contamination passing from the substrate WA through the opening 301 and into the projection system PS. The flow of gas (which may be hydrogen gas) is schematically represented by arrows in FIG. 4. The gas travels through the pipe 310 into the annular chamber 308. The gas travels within the annular chamber 308 such that the pressure of gas at the entrance to the annular slit 306 is substantially equal around the circumference of the annular chamber. The annular chamber 308 may include a baffle (not shown) which acts to encourage the gas to travel within the annular chamber, thereby assisting with equalization of the pressure of the gas within the annular chamber. Gas passes through the annular slit 306 and into the opening 301. A proportion of the gas travels upwards into the projection system PS. The remainder of the gas travels downwards, passing out of the opening 301 and then travelling away from the opening in a gap between the projection system PS and the substrate WA. The flow of gas out of the opening 301 prevents or suppresses the passage of contamination from the substrate WA into the projection system PS.

The flow of gas from the opening 301 onto the substrate WA may heat or cool the substrate in an undesirable manner. It may be desirable to reduce the extent to which the gas causes heating or cooling of the substrate. In the following description, the term "heating" is used, but the invention is equally applicable for the reduction of cooling. In an embodiment of the invention, this may be achieved by configuring the wall 313 of the projection system which faces, in use, the substrate WA or substrate table WT, such that it has an effective thermal accommodation coefficient of 0.4 or greater (the effective thermal accommodation coefficient is defined below). In an embodiment of the invention, this may be achieved by configuring the wall 313 of the projection system such that the wall 313 absorbs more heat from the gas than from a conventional projection system wall. In an embodiment of the invention, this may be achieved by configuring the wall 313 of the projection system such that the wall 313 absorbs more heat from the gas than from a conventional substrate. In an embodiment of the invention, this may be achieved by configuring the wall 313 of the projection system such that the wall 313 absorbs more heat from the gas than from the substrate table WT. In an embodiment, this may be achieved by providing the wall 313 of the projection system with a structure which is configured to increase the thermal accommodation coefficient of the surface. The structure of the wall 313 may, for example, be embodied as a periodically varying height profile in a cross sectional plane perpendicular to the surface of the wall facing, in use, the substrate WA. Examples of such structures are discussed below in the context of FIGS. 5, 6, and 7.

The thermal accommodation coefficient of a substantially smooth material surface is a known parameter, and is explained for example in Correlation of Thermal Accommodation Coefficient for 'Engineering' Surfaces by S. Song and M. M. Yovanovich, American Society of Mechanical Engineers, 1987, p. 107-116, which is incorporated herein by reference. As explained in that document, the thermal accommodation coefficient is defined, and measured, for smooth material surfaces. The thermal accommodation coefficient determines the extent to which a heat load is transferred from a gas to a material (the thermal accommodation coefficient may be considered to be the fraction of excess energy that is transferred from the gas to the material). The thermal accommodation coefficient α is defined as $$\alpha = \frac{E_{rs} - E_i}{E_{ss} - E_i}, \quad (2)$$

where $E_i$ and $E_{rs}$ are the incident and reflected energy fluxes due to thermal energy of gas molecules, and $E_{ss}$ is the energy flux that would be reflected if the gas were in thermal equilibrium with the substantially smooth surface of the material. The thermal accommodation coefficient can in theory vary between 0 (no heat is transferred from the gas to the material) and 1 (all heat is transferred from the gas to the material).

Correlation of Thermal Accommodation Coefficient for 'Engineering' Surfaces by S. Song and M. M. Yovanovich, American Society of Mechanical Engineers, 1987, p. 107-

116 provides an expression for predicting a thermal accommodation coefficient for a solid surface. In addition, the article mentions values of thermal accommodation coefficient measured by previous authors. The values include a thermal accommodation coefficient of 0.26 used for a material surface upon which hydrogen gas was incident. The values also include a range of thermal accommodation coefficients from 0.07 to 0.38 for material surfaces upon which helium gas was incident. For simplicity, where the context allows, any reference to an object (such as the wall 313) having a thermal accommodation coefficient may be interpreted as referring to the thermal accommodation coefficient of the surface of the object which, in use, is adjacent or proximate to the substrate. Surfaces of many materials which are used in a lithographic apparatus may have a thermal accommodation coefficient of around 0.3 for hydrogen gas (e.g. aluminum, steel, silicon-infiltrated silicon carbide, and glass).

The substrate WA may have an upper surface which comprises a photoresist onto which a pattern will be exposed by EUV radiation. The photoresist may for example have a thermal accommodation coefficient for Hydrogen gas which is similar to the 0.26 value mentioned above. For simplicity it is assumed here that the photoresist has a thermal accommodation coefficient of around 0.3 for Hydrogen gas. For ease of explanation, the substrate WA, and the surface of the substrate, may be referred to without explicitly referring to the presence of the photoresist. References to the substrate WA, and the surface of the substrate, may be considered to include photoresist where appropriate.

In a conventional lithographic apparatus, the projection system wall 313 may have a thermal accommodation coefficient of around 0.3 (i.e. may have the same or similar thermal accommodation coefficient as the substrate WA). Thus, when gas is flowing between the substrate WA and the projection system wall 313 (as shown in FIG. 4), the amount of heat which is exchanged between the gas and the substrate WA may be the same as or similar to the amount of heat which is transferred from the gas to the projection system wall. It may be desirable to provide the projection system wall 313 with a higher thermal accommodation coefficient than the substrate WA because this will cause more of the heat to be exchanged from the gas to the projection system wall than to the substrate. This may be desirable because it will reduce the amount of heat which is absorbed from the gas by the substrate WA, and will thus reduce expansion of the substrate caused by heating. Reducing such expansion may be desirable because it may improve the accuracy with which a pattern projected onto the substrate is overlaid onto a previously projected pattern.

If the thermal accommodation coefficient of the projection system wall 313 were to be 1 or close to 1, then the heat load transferred from the gas to the wafer W would be approximately a fraction $\alpha/2$ of the total heat source, where $\alpha$ is the thermal accommodation coefficient of the substrate WA. In this context, the term total heat source may be considered to mean the total heat being transferred from the gas as it travels through the gap between the substrate WA and the projection system wall 313. For the purpose of this example, it is assumed that the pressure of the gas is sufficiently low that the mean free path of the gas molecules is comparable to or larger than the distance between the substrate WA and the projection system wall 313. If the thermal accommodation coefficient of the substrate WA were to be 0.3, then this would reduce the heat load applied to the substrate to 0.3/2 (15%) of the total heat load, with 1.7/2 (85%) of the total heat load being applied to the projection system wall 313. The heat load being applied to the substrate WA may thus have been reduced from around 50% to around 15%, a reduction by a factor of 3.3.

In practice, it may not be possible to provide the projection system wall 313 with a thermal accommodation coefficient of 1 or close to 1. However, it is possible to provide a projection system wall 313 with an effective thermal accommodation coefficient which is significantly greater than the thermal accommodation coefficient of the substrate WA. The effective thermal accommodation coefficient $\alpha_{EFF}$ of the projection system wall 313 may be defined by:

$$\alpha_{EFF} = \frac{E_r - E_i}{E_s - E_i}, \qquad (3)$$

where $E_i$ and $E_r$ are the incident and reflected energy fluxes due to thermal energy of gas molecules, and $E_s$ is the energy flux that would be reflected if the gas were in thermal equilibrium with the surface of the material, and where equation (3) takes into account the structure of the projection system wall 313 (i.e. does not assume that the projection system wall is a substantially smooth surface). By providing the projection system wall 313 with a structure (for example a repeating structure), the effective thermal accommodation coefficient $\alpha_{EFF}$ of the projection system wall may be increased. The structure may for example comprise a series of ridges, or an array of holes such as a honeycomb structure.

In an embodiment, the projection system wall 313 may have an effective thermal accommodation coefficient which is significantly greater than the thermal accommodation coefficient of the substrate WA (or the effective thermal accommodation coefficient of the substrate if these are different). In an embodiment, the projection system wall 313 may have an effective thermal accommodation coefficient for hydrogen gas of 0.4 or greater, 0.6 or greater, or 0.8 or greater. In an embodiment, the projection system wall 313 may have an effective thermal accommodation coefficient for helium gas of 0.5 or greater, 0.7 or greater, or 0.9 or greater. In an embodiment, the projection system wall 313 may have an effective thermal accommodation coefficient which is significantly higher than the thermal accommodation coefficient of the material used to form the projection system wall (i.e. the thermal accommodation coefficient of a smooth surface formed from that material).

Figure 5:
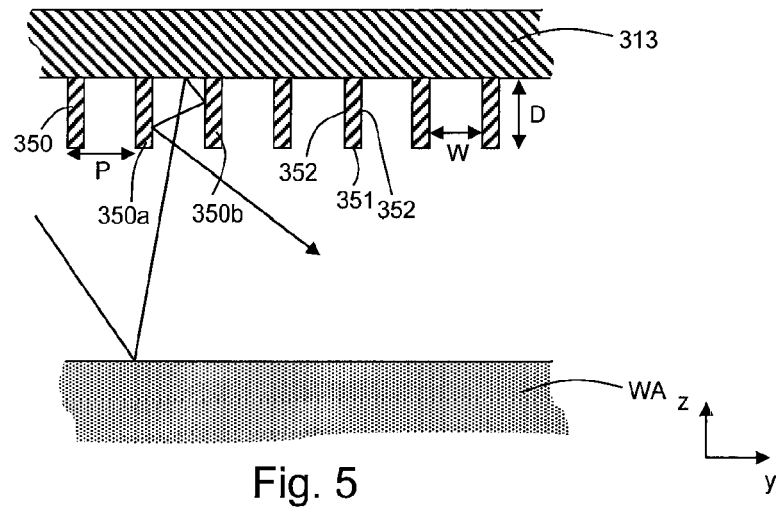
FIG. 5 schematically depicts part of a wall of the projection system provided with a structure according to an embodiment of the invention.

The structure may comprise a plurality of ridges which extend from the projection system wall 313, for example as shown in cross-section in FIG. 5. The ridges 350 may be formed for example by cutting grooves into the projection system wall 313. FIG. 5 shows part of the projection system wall 313 and part of the substrate WA, and shows a plurality of ridges 350 which extend from the projection system wall towards the substrate. The mean free path of gas molecules when travelling in the gap between the substrate WA and the projection system wall may be taken into account when determining the width W and depth D of the ridges. Similarly, the mean free path of gas molecules when travelling in the gap between the substrate WA and the projection system wall may be taken into account when determining other properties of the ridges such as a pitch characteristic for a repeating ridge structure.

In one example, gas in the gap between the substrate WA and the projection system wall 313 may be hydrogen gas. The hydrogen gas may for example have a pressure of between 20 Pascals and 1 Pascal (the pressure may be highest in the immediate vicinity of the opening 301 and may decrease as the gas travels away from the opening and towards the periphery of the substrate WA). The hydrogen gas molecules may have a mean free path which typically varies between 0.5 mm and 10 mm at these pressures. It may be desirable to provide the ridges 350 (or other structure) with a width which is less than a mean free path of the gas. This reduces the likelihood that a gas molecule enters a space defined by the structure, collides with another gas molecule, and exits the space defined by the structure without being incident upon the structure itself. The pressure ranges (and associated mean free paths) referred to above are merely provided as examples, and other pressures may be used.

If the ridges 350 (or other structure) have a width which is significantly smaller than the mean free path of the gas molecules (for example smaller by a factor of 10 or more), then further reduction of the width between the ridges may not have a significant effect upon the likelihood of interactions occurring between gas molecules and the ridges. However, if the ridges 350 (or other structure) have a width which is similar to or larger than the mean free path of the gas molecules, then reducing the width between the ridges will increase the likelihood of interactions occurring between the gas molecules and the ridges, thereby increasing heat exchange between the gas molecules and the wall (similarly, increasing the width between the ridges will reduce the likelihood of interactions occurring).

Interaction between a gas molecule and the projection system wall 313 is now described with reference to FIGS. 4 and 5. A path traveled by a gas molecule which has exited the opening 301 (see FIG. 4) is represented schematically by an arrow in FIG. 5. As may be seen, the gas molecule is initially incident upon the substrate WA. The gas molecule will transfer some energy to the substrate when it is reflected from the substrate. After being reflected from the substrate WA the gas molecule travels towards the projection system wall 313 and enters a space defined by two adjacent ridges 350a, 350b. The gas molecule is incident upon a portion of the projection system wall 313 which is between the two ridges 350a, 350b, is then incident upon a first ridge 350b, and is then incident upon a second ridge 350a. Each interaction between the gas molecule and the projection system wall/ridges causes energy to be exchanged between the gas molecule and the projection system wall/ridges. After the gas molecule has exited the space defined by the ridges 350a, 350b it again travels towards the substrate WA and will be incident upon the substrate. Energy will again be exchanged between the gas molecule and the substrate WA. The gas molecule will again travel towards the projection system wall/ridges. In this way the gas will travel from the opening 301 (see FIG. 4) to beyond the edge of the substrate WA.

As will be appreciated from the schematic illustration in FIG. 5, during the passage of the gas molecule to the edge of the substrate it will interact with the projection system wall/ridges 313, 350 approximately three times as often as it interacts with the substrate WA. Consequently, more heat will be exchanged between the gas molecule and the projection system wall/ridges 313, 350 than will be exchanged between the gas molecule and the substrate WA. If the ridges 350 were not present and the projection system wall 313 were to have the same thermal accommodation coefficient as the substrate WA, then the number of interactions between the gas molecule and the projection system wall might be roughly the same as the number of interactions between the gas molecule and the substrate. As a result, approximately the same amount of heat would be exchanged between the gas molecule and the substrate as would be exchanged between the gas molecule and the projection system wall. The ridges 350 increase the amount of heat which is exchanged between the gas molecule and the projection system wall 313, and reduce the amount of heat which is exchanged between the gas molecule and the substrate WA, thereby reducing heating of the substrate. This may be advantageous because it reduces thermal expansion of the substrate, and thus may allow a pattern to be projected onto the substrate WA with more accurate overlay than might otherwise be the case.

The ridges 350 may be shaped such that the surface area of sides of a ridge is greater than the surface area of a face of a ridge (where the face of the ridge is the portion of the ridge which faces towards the substrate table). For example, a face 351 of a ridge may constitute 30% or less of the total surface area of a ridge. The remaining 70% or more of the surface area of the ridge may be provided by sides 352 of the ridge. If the ridge 350 was to be provided with a large face then this would increase the likelihood of a gas molecule interacting with the face of the ridge and being directed back towards the substrate WA without entering a space defined by the ridge and an adjacent ridge. If this were to occur then only one interaction between the gas molecule and the ridge would happen before the gas molecule traveled back towards the substrate WA. Thus, the potential advantage provided by the ridges, i.e. that the gas molecule interacts multiple times with the ridges/projection system wall before travelling back towards the substrate WA, would be lost.

The ridges 350 may be provided with a configuration in which a face which faces towards the substrate WA (or substantially towards the substrate WA) comprises less than 50% of the surface area of the structure, less than 40% of the surface area of the structure, or less than 30% of the surface area of the structure. Similarly, structures other than ridges may be provided with a configuration in which a portion which faces towards the substrate WA (or substantially towards the substrate WA) comprises less than 50% of the surface area of the structure, less than 40% of the surface area of the structure, or less than 30% of the surface area of the structure.

The ridges 350 (or other repeating structure) may be periodic. The pitch P of the structure may be 1 mm or less. The term "pitch" as used herein may be considered to mean the distance between adjacent repeating portions of a structure, for example measured perpendicular to a wall which forms part of the structure. The pitch of 1 mm may be provided at a portion of the projection system wall which is adjacent to the opening 301, with a greater pitch being provided at portions of the projection system wall are which further from the opening (the mean free path of the gas molecules is longer further from the opening). Alternatively, substantially all of the structured portion of the projection system wall 313 may be provided with a repeating structure having a pitch of 1 mm or less.

The structure may comprise ridges which are generally rectangular in cross-section (e.g. as shown in FIG. 5). Alternatively, the structure may comprise ridges 360 which are generally V-shaped in cross-section (as shown schematically in FIG. 6), or ridges having some other cross-sectional shape. Alternatively, the structure may comprise a honeycomb structure 361, as shown schematically in FIG. 7. Alternatively, the structure may comprise some other structure which comprises an array of holes, for example circular holes. The holes may be provided as a repeating structure. Alternatively, the holes may be provided as a non-repeating structure (e.g. a random or pseudo-random array of holes). Any suitable structure may be used. The structure may be a repeating structure.

Figure 6:
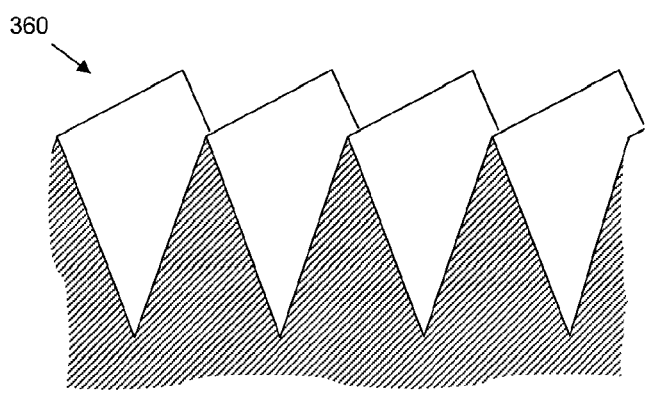
FIG. 6 schematically depicts part of a structure according to an embodiment of the invention.
Figure 7:
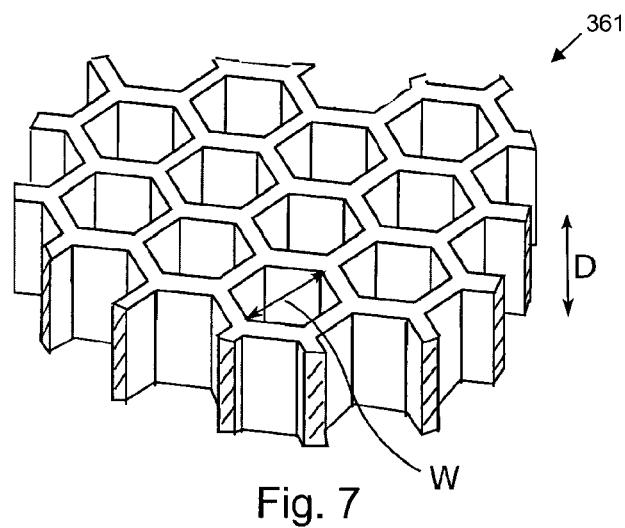
FIG. 7 schematically depicts part of a structure according to an embodiment of the invention.

When designing ridges or some other structure to provide a useful effective thermal accommodation coefficient the aspect ratio R of the depth D over the width W (i.e. the ratio R=D/W) of the structure may be taken into account. In this context, the depth may be taken as being the distance from a bottom end of a structure feature to the top end of a structure feature (e.g. as illustrated in FIG. 5). In this context, for a structure having sides which extend perpendicularly from the a wall or other base, the width W may be taken as being the separation between adjacent parts of the structure. For example, in FIG. 5 the width W is the separation between ridges (as illustrated). In the case of a honeycomb arrangement, the width W may be taken as being the widest diameter of the holes (as illustrated). In the case of an array of circular holes, the width W may be taken as being the diameter of the holes. If walls of a structure include some tapering at an outer end, the tapering may be ignored when determining the width W. In the case of V-shaped grooves (e.g. as shown in FIG. 6), the width may be taken as being the width of the grooves halfway up their height.

The fraction f of the structure which is occupied by space may also be taken into account. In case of ridges as shown in FIG. 5, the fraction f is the width W as a fraction of a pitch at which the ridges are arranged. More generally, the fraction f may be defined as a fractional area in a plane parallel to the surface of the wall and passing through the surface structure of the wall. In the case of an array of holes, the fraction f may be defined in such a cross-sectional plane as the fraction f of the cross-sectional area of the empty spaces of a plurality of holes divided by the total cross-sectional area of that plurality of holes (i.e. including structure which defines the holes). Similarly, in case of an array of V-grooves, the fraction f may be defined in a plane parallel to the surface of the wall, the plane just touching outer tops of the grooves. As before, the fraction f then is the cross-sectional area in this plane, of the empty spaces of a plurality of V-grooves, divided by the total cross-sectional area of that plurality of V-grooves. The fraction f may be referred to as the filling fraction f. The depth D and pitch P of the ridges 350 are labelled in FIG. 5.

Figure 8:
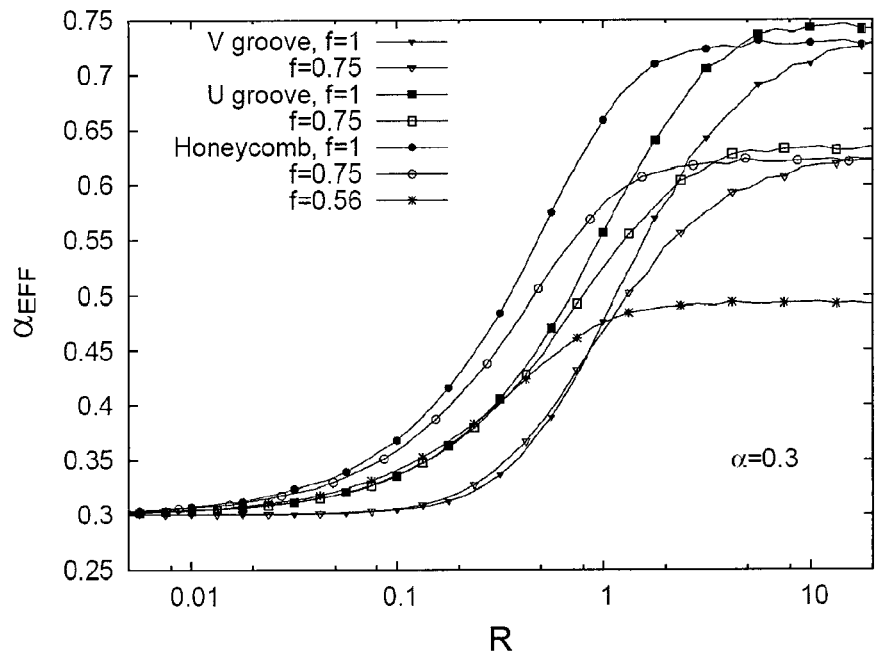
FIG. 8 is a graph which shows how the structures shown in FIGS. 5-7 change the effective thermal accommodation coefficient of a surface.

FIG. 8 is a graph which represents how the effective thermal accommodation coefficient of several different structures increases as the aspect ratio R (i.e. depth/width) increases. The data shown in FIG. 8 were generated using a simulation, with the assumption that the thermal accommodation coefficient of the surface on which the structures are provided is 0.3. As may be seen from FIG. 8, as the aspect ratio increases the effective thermal accommodation coefficient starts to rise. When the aspect ratio is 1, the effective thermal accommodation coefficient has increased to in excess of 0.45 for some structures, and to in excess of 0.5 for other structures. The simulation was performed for a filling fraction f of 1, 0.75 and 0.56. In practice a filling fraction f of 1 is not possible because the entire structure would be space. However, a filling fraction of 0.75 is possible, and a filling fraction of 0.56 is also possible. The simulation thus gives an indication of increases of effective thermal accommodation coefficient that are practically achievable.

For a given depth/width ratio R<5 and filling fraction f, it may be seen from FIG. 8 that a honeycomb lattice works best, followed by rectangular ridges (labelled as U-grooves), followed by V-shaped ridges (labelled as V-grooves). At very high aspect ratios (R>5), rectangular ridges perform slightly better than the honeycomb lattice. The ridges become more effective as they become thinner. For a mechanically reasonable ratio R of 2 and f=0.75 (wall thickness is a quarter of the pitch for ridges or ⅛ of the pitch for the honeycomb), the initial thermal accommodation coefficient of 0.3 can be increased to an effective thermal accommodation coefficient of 0.6.

Figure 9:
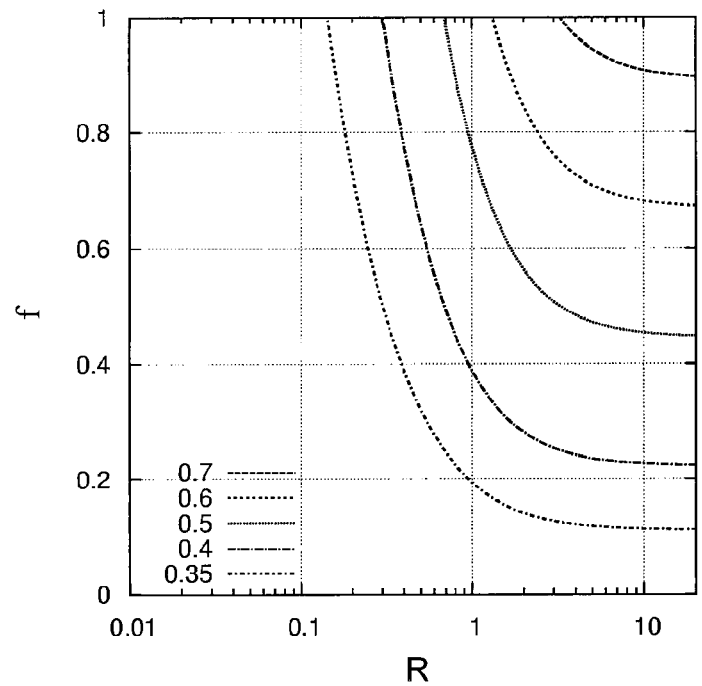
FIG. 9 is a graph which shows how properties of the structure shown in FIG. 5 affect the effective thermal accommodation coefficient of a surface.

FIG. 9 is a graph which represents how the effective thermal accommodation coefficient of a ridge structure (i.e. the structure shown in FIG. 5) varies as a function of the filling fraction f and aspect ratio R of the ridge structure. The data shown in FIG. 9 were generated using a simulation. The graph in FIG. 9 assumes that the thermal accommodation coefficient of the material is 0.3 (i.e. this is the thermal accommodation coefficient if the material has a smooth surface). The ridge structure provides an effective thermal accommodation coefficient which is in excess of 0.3; contour lines indicating combinations of filling fraction and aspect ratio which will provide an effective thermal accommodation coefficient of 0.35. 0.4, 0.5, 0.6 and 0.7. Thus, if it is desired to provide an effective thermal accommodation coefficient of 0.4 using a material which has a thermal accommodation coefficient of 0.3, FIG. 9 may be used to determine a combination of filling fraction and aspect ratio which will provide this. For example, a filling fraction of around 0.8 and an aspect ratio of around 0.45 may be used (or any other combination of filling fraction and aspect ratio which lies on the contour line 0.4). If it is desired to provide an effective thermal accommodation coefficient in excess of 0.4 then any combination of filling fraction and aspect ratio which lies above and to the right of the contour line 0.4 may be used.

Figure 10:
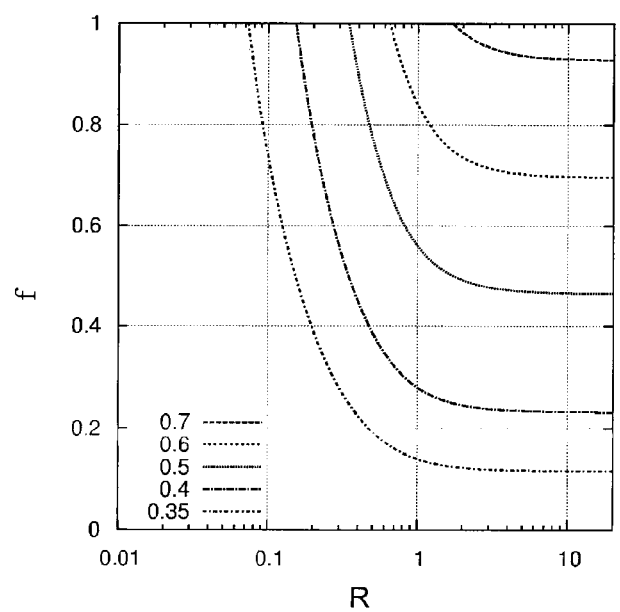
FIG. 10 is a graph which shows how properties of the structure shown in FIG. 7 affect the effective thermal accommodation coefficient of a surface.

FIG. 10 is a graph which represents how the effective thermal accommodation coefficient of a honeycomb structure (i.e. the structure shown in FIG. 7) varies as a function of the filling fraction f and aspect ratio R of the ridge structure. The data shown in FIG. 10 were generated using a simulation. The graph in FIG. 10 assumes that the thermal accommodation coefficient of the material is 0.3 (i.e. this is the thermal accommodation coefficient if the material has a smooth surface). The honeycomb structure provides an effective thermal accommodation coefficient which is in excess of 0.3, contour lines indicating combinations of filling fraction and aspect ratio which will provide an effective thermal accommodation coefficient of 0.35, 0.4, 0.5, 0.6 and 0.7. Thus, if it is desired to provide an effective thermal accommodation coefficient of 0.4 using a material which has a thermal accommodation coefficient of 0.3, FIG. 10 may be used to determine a combination of filling fraction and aspect ratio which will provide this. For example, a filling fraction of around 0.8 and an aspect ratio of around 0.2 may be used (or any other combination of filling fraction and aspect radio which lies on the contour line 0.4). If it is desired to provide an effective thermal accommodation coefficient in excess of 0.4, then any combination of filling fraction and aspect ratio which lies above and to the right of the contour line 0.4 may be used.

The filling fraction f and aspect ratio R may be used to determine a figure of merit for a repeating structure. The figure of merit may be defined as:

$$\frac{f^{2.04}}{1+0.47\cdot R^{-1.96}} \quad (4)$$

It may be desirable to provide a repeating structure which has a figure of merit which is greater than for example 0.05. The figure of merit may for example be applied to a honeycomb structure, or other repeating structure which comprises an array of holes. The figure of merit may be applied for a material having a particular thermal accommodation coefficient (e.g. 0.3). The figure of merit may for example be applied to other structures such as ridges (e.g. in combination with another criterion such as an aspect ratio in excess of 0.2).

In general, a repeating structure provided on the projection system wall 313 may be provided with the same pitch across substantially all of the structure. Alternatively, a repeating structure provided on the projection system wall 313 may be provided with a pitch which varies across the structure. The pitch may for example become larger as the distance from the structured surface to the opening 301 increases. In embodiments in which the pitch of a structure varies, the average pitch of the structure may be used to characterise the structure.

In an embodiment, the structure may be a non-repeating structure. The structure may for example be a random or pseudo-random structure (e.g. an irregular array of holes of different sizes). Where this is the case, the filling fraction f and aspect ratio R of the structure used for the figure of merit calculation of equation (4) may be the average filling fraction f and the average aspect ratio R.

The structure may be provided on the projection system wall for example through appropriate machining of the projection system wall (e.g. using mechanical cutting or laser cutting). Alternatively, the structure may be provided on the projection system wall using a lithographic process. The lithographic process may be capable of forming a structure having a smaller pitch than a structure formed using machining.

Although embodiments of the invention have been described above in the context of a projection system wall which is adjacent to a substrate during use of a lithographic apparatus, the invention may be applied to other components of a lithographic apparatus. The invention may be useful for example in any vacuum environment in which it is desired to improve heat transfer from a component, e.g. heat transfer from the component to a heat sink.

Figure 11:
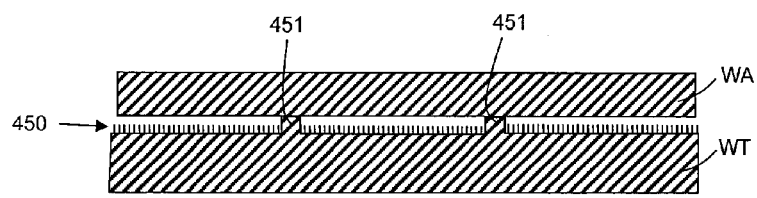
FIG. 11 schematically depicts a substrate table provided with a structure according to an embodiment of the invention.

In an embodiment, shown schematically in cross-section in FIG. 11, a substrate table WT is provided with a structure 450 (e.g. a repeating structure). The structure 450 may be any suitable structure, for example a honeycomb structure, array of holes, series of ridges, etc. The height of the structure 450 is less than the height of burls 451 which project upwards from the substrate table WT (such that the structure doesn't come into contact with a substrate WA in use). The structure 450 may for example have a depth and/or pitch which is of the same order as or smaller than the mean free path of gas molecules (e.g. hydrogen) at the gas pressure that exists when a substrate WA is held by the substrate table WT. The gas pressure when a substrate WA is held by the substrate table WT may for example be around 1000 Pa. The depth and/or pitch of the structure 450 may for example be less than 20 microns, and may for example be less than 10 microns, and may for example be less than 1 micron. The structure 450 could for example be formed on the substrate table WT using electron-beam lithography. The structure 450 increases the transfer of heat from the substrate WA to the substrate table WT (compared with for example a smooth surface which is not provided with the repeating structure). The temperature of the substrate WA may consequently be better controlled.

Figure 12:
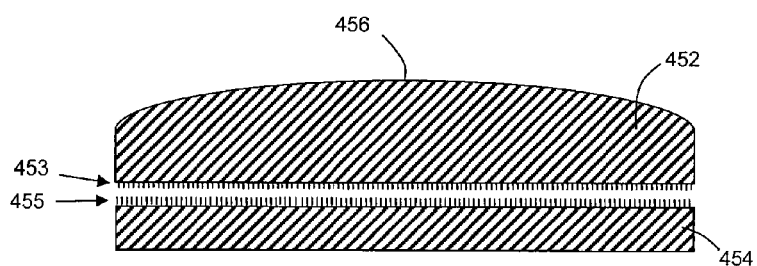
FIG. 12 schematically depicts a mirror and a heat sink provided with a structure according to an embodiment of the invention.

In an embodiment, shown schematically in cross-section in FIG. 12, a mirror 452 is provided with a structure 453 (e.g. a repeating structure). The mirror 452 may for example comprise one of the mirror devices 22, 24 or one of the reflective elements 28, 30 shown in FIG. 2, or may comprise some other mirror which forms part of the lithographic apparatus. The structure 453 is provided on an opposite side of the mirror 452 from a reflective surface 456 (e.g. a multilayer coating). The structure 453 may be any suitable structure, for example a honeycomb structure, array of holes, ridges, etc. A heat sink 454 is also provided with a structure 455 (e.g. a repeating structure). The structure 455 may be any suitable structure, for example a honeycomb structure, array of holes, series of ridges, etc. The structures 453, 455 may for example each have a depth and/or pitch which is of the same order as or smaller than the mean free path of gas molecules (e.g. hydrogen) at the gas pressure that exists during operation of the lithographic apparatus. The gas pressure during operation of the lithographic apparatus may for example be around 4 Pa. The depth and/or pitch of the repeating structure 450 may for example be less than 5 millimeters, and may for example be less than 3 millimeters. The structure 450 could for example be formed on the mirror 452 and/or the heat sink 454 using conventional milling or laser cutting techniques. The structures 453, 455 increase the transfer of heat from the mirror 452 to the heat sink 454 (compared with the case if the mirror and the heat sink both had smooth surfaces and were not provided with the structure). The temperature of the mirror 452 may consequently be better controlled.

Although FIG. 12 shows structures on both the mirror 452 and the heat sink 454, a structure may for example be provided on only the mirror or on only the heat sink. However, providing the structure on both the mirror 452 and the heat sink 454 will provide the most effective transfer of heat from the mirror to the heat sink.

In an embodiment, a structure (e.g. a repeating structure) such as the structures described above may be provided on an internal wall of a chamber of a lithographic apparatus within which substrates are located during alignment measurements and/or substrate exposure. The structure may be positioned such that it shields a metrology frame of the lithographic apparatus from heat generated in the chamber (e.g. heat emanating from electrical cables). The metrology frame may be a frame which does not expand or contract significantly, thereby allowing accurate position measurements to be performed.

The projection system wall 313, substrate table WT, mirror 452, heat sink 454, and internal chamber wall are all example of components upon which a structure (e.g. a repeating structure) which embodies the invention may be provided. The structure (e.g. repeating structure) may be provided on any suitable component.

In addition to increasing the thermal accommodation coefficient of a component surface, the structure will also increase the efficiency of radiative heat exchange between components. The increase will be strongest if the depth and/or pitch of the structure is larger than the wavelength of thermal radiation being emitted by the component.

The term "structure" is intended to encompass interconnected features (e.g. holes of a honeycomb structure) and to encompass a series of ridges or equivalent structure. It is not intended to encompass isolated features such as burls on a substrate table. Similarly, the term "repeating structure" is intended to encompass interconnected features (e.g. holes of a honeycomb structure) and to encompass a series of ridges or equivalent structure. It is not intended to encompass isolated features such as burls on a substrate table.

In an embodiment, the structured surface of a component may provide that surface of the component with an effective thermal accommodation coefficient which is significantly higher than the thermal accommodation coefficient of the material used to form that surface of the component (i.e. the thermal accommodation coefficient of a smooth surface formed from that material).

In an embodiment, the structured surface of a component may have a pitch which is less than a mean free path of gas that will be in the vicinity of the structured surface during operation of the lithographic apparatus. This reduces the likelihood that a gas molecule enters a space defined by the structure, collides with another gas molecule, and exits the space defined by the structure without being incident upon the structure itself.

Attributes of the structures described further above in relation to the projection system wall may also apply to structures provided on other components.

The effective thermal accommodation coefficient of a component surface provided with a structure may be measured by measuring the heat flux between two parallel plates as a function of gas pressure (the plates being formed from the same material as the component surface and being provided with the same structure). The heat flux Q (in $Wm^{-2}$ units) is given by the expression:

$$Q = \left(\frac{Ap}{1 + ApH/k} + h_R\right)\Delta T, \quad (5)$$

where A is the molecular heat transfer coefficient (see below), p the pressure, $\Delta T$ the temperature difference between the plates, H the distance between the plates, k the thermal conductivity of the gas (0.17 $Wm^{-1}K^{-1}$ for hydrogen at 295 K), and $h_R$ is the radiative heat transfer coefficient (depending on surface material properties and temperature; typical values $0.15 < h_R < 5\ Wm^{-2}K^{-1}$). The gas-related part of the expression (5) is known as the Sherman-Lees model for heat transfer.

If the two plates have identical effective thermal accommodation coefficients $\alpha$ and temperatures $T_1$ and $T_2$, and we define the mean temperature $T_m = (T_1 + T_2)/2$, then the molecular heat transfer coefficient is given by $$A = \frac{\alpha}{2-\alpha}(1 + \zeta/4)\sqrt{\frac{2R_u}{\pi M T_m}p}, \quad (6)$$

where $\zeta$ is the number of internal degrees of freedom of the gas molecule ($\zeta=2$ for hydrogen, $\zeta=0$ for helium), $R_u=8.3$ J $mol^{-1}$ $K^{-1}$ is the universal gas constant, and M is the molar mass (0.002 kg/mol for hydrogen). For example, for hydrogen at a temperature of 295 K and $\alpha=0.3$, $A=0.8\ Wm^{-2}K^{-1}$ $Pa^{-1}$.

The effective thermal accommodation coefficient at temperature $T_m$ can be determined by measuring heat transfer between two identical plates as a function of pressure and fitting the parameters $\alpha$ and $h_R$. For maximum accuracy, the temperature difference $\Delta T$ may be small, i.e., $\Delta T/T_m < 0.1$, the pressure may be varied in the range $0 < p < k/(AH)$ and H may be chosen such that $H \ll k/h_R$ and $H/D < 0.1$ for a plate diameter D. In the case of a surface structure with depth d, H may also be chosen such that $H/d > 10$. For example, under certain conditions, one may do this measurement for p varying in the range 0 to 6 Pa, with H=20 mm, D=200 mm, at room temperature ($T_m = 295$ K), and a temperature difference $\Delta T = 20$ K.

In an embodiment, a component surface may be provided with a structure which comprises a macroscopic structure (e.g. repeating structure) on top of which a microscopic structure is provided (e.g. the surface of the structure may be roughened). For example, the macroscopic structure may have a feature size of the order of millimeters, and the microscopic structure may have a feature size of the order of micrometers (or less). The microscopic structure may reduce the likelihood of a gas molecule entering the macroscopic structure and leaving the macroscopic structure after only one interaction with it.

In an alternative approach, instead of providing a structure (e.g. repeating structure) on a component surface, the component surface may be roughened. In an embodiment, the roughened surface may be formed by milling, etching, sanding, sand blasting, abrasive blasting, or brushing the component surface. The component surface may for example be formed from steel or some other metal which may be suited to roughening using one of these methods.

Providing the component surface with a roughened surface and providing the component surface with a structure both have in common that they provide an increase of the surface area of the component surface (compared with a conventional smooth component surface). The component surface may be considered to have a greater surface area per unit of projected two-dimensional area than a conventional component surface. The term 'projected two-dimensional area' may be considered to mean the area in a plane beneath the component surface which is filled by a projection of the component surface onto that plane. In the case of the projection system wall 313, the plane may be substantially parallel to the lowermost wall of the projection system. If the lowermost wall of the projection system if not flat, then the plane may be a plane which provides a best fit to the lowermost wall of the projection system.

The term 'surface area' may be considered to refer to the surface area both on a microscopic and macroscopic scale which is available to interact with gas. The increase of the surface area of the component surface facilitates more interactions between gas molecules and the component surface than would otherwise be the case (i.e. if a conventional component surface had been used). Increasing the surface area of the component surface may be considered to increase its effective thermal accommodation coefficient. Roughening the surface of the component surface and providing the component surface with a structure may both be considered to increase the effective thermal accommodation coefficient of the component surface (and may provide the component surface with an effective thermal accommodation coefficient of 0.4 or more).

In an embodiment, the component surface may be provided with a porous coating. The porous coating increases the surface area of the component surface (in common with other embodiments of the invention). The increase of the surface area of the component surface takes place on a micrometer scale rather than on a millimeter or centimeter scale. The porous coating may for example be formed from a ceramic, or any other suitable material. The porous coating may be formed using any suitable technique. The porous coating may for example be formed using hard anodizing, physical vapour deposition (PVD), laser sintering or enameling. The porous coating may for example be formed using thermal spraying. The porous coating increases the effective thermal accommodation coefficient of the component surface (and may provide the component surface with an effective thermal accommodation coefficient of 0.4 or more). Suitable porous coatings, with a high specific surface area, are commercially available, e.g. from Acktar Ltd, Israel. In the case of the projection system wall 313, the porous coating may provide that portion of the projection system wall which is adjacent to a substrate in use with a surface area which is greater than the surface area of a conventional projection system wall.

In an embodiment, the porous coating may be applied to a structure provided on the projection system wall (for example the ridge structure shown in FIG. 5). In an embodiment, the porous coating may be applied to a roughened projection system wall.

In an embodiment, a metal layer may be provided on top of the porous coating. The metal layer may for example be aluminium or some other reflective metal. The metal layer may for example be provided with a thickness which is sufficiently small that the porous nature of the coating is retained (i.e. a substantial proportion of pores of the porous coating are not closed by the metal layer). The metal layer may for example be provided with a thickness of a few nanometers (or more). The metal layer may have the advantage that it provides the porous layer with an optical reflectivity at infrared wavelengths which is similar to the optical reflectivity at infrared wavelengths of other parts of the lithographic apparatus. This may prevent or reduce the extent to which the porous coating acts as a disproportional absorber of infrared radiation in the lithographic apparatus (compared with other parts of the lithographic apparatus). This in turn may prevent or reduce the extent to which the porous coating (and projection system wall 313) are heated more than other parts of the lithographic apparatus during operation of the lithographic apparatus. Using a metal layer to provide optical reflectivity at infrared wavelengths may be advantageous in locations in which infrared reflectivity is desired. In other locations, if infrared absorption is desired, the metal layer may be omitted.

In an embodiment, the component surface may be provided with a layer of 'super black', which may be formed by chemically etching an alloy such as nickel-phosphorus alloy (or using any other suitable technique). The 'super black' may increase the effective thermal accommodation coefficient of the component surface (and may provide the component surface wall with a thermal accommodation coefficient of 0.4 or more). The 'super black' may provide that portion wall of the projection system wall which is adjacent to a substrate in use with a surface area which is greater than the surface area of a conventional projection system wall. More information regarding 'super black' may be found in "The physical and chemical properties of electroless nickel-phosphorus alloys and low reflectance nickel-phosphorus black surfaces" by Richard J. C. Brown, Paul J. Brewer and Martin J. T. Milton, J. Mater. Chem., 2002, 12, 2749-2754.

Figure 13:
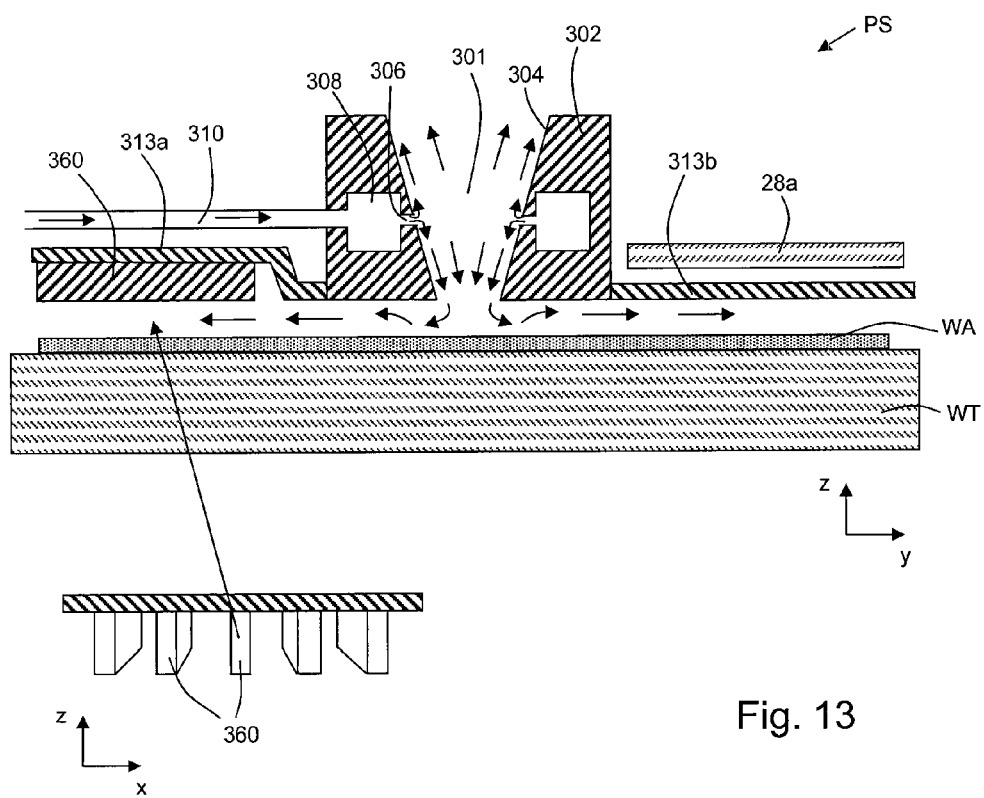
FIG. 13 schematically depicts part of a projection system and a substrate table of the lithographic apparatus according to an embodiment of the invention.

In an embodiment, the surface area of the projection system wall 313 may be increased by providing a plurality of baffles which extend from the projection system wall towards the substrate table WT. The baffles may provide that portion wall of the projection system wall which is adjacent to a substrate in use with a surface area which is greater than the surface area of a conventional projection system wall. FIG. 13 shows schematically a lithographic apparatus which corresponds in large part with the lithographic apparatus shown in FIG. 4. Features which correspond with features of the lithographic apparatus shown in FIG. 4 are provided with the same reference numerals. The protruding portion 320 is absent from the apparatus, and the substrate WA (and substrate table WT) is closer to the projection system wall 313a, 313b than is the case in the apparatus shown in FIG. 4. The portion of the projection system wall 313a which is to the left of the opening 301 in FIG. 13 is raised such that the majority of the projection system wall has an increased separation from the substrate WA (and substrate table WT). Baffles 360 extend from the raised projection system wall 313a towards the substrate WA. Although only a single baffle 360 is visible in the illustration of the lithographic apparatus, FIG. 13 also includes a separate perspective view of the baffles 360 as viewed from an outer end of the baffles.

The baffles 360 provide an increase of the surface area of the projection system wall 313a. As a result of this increase of the surface area the gas interacts more often with the projection system wall 313a than would be the case if the baffles were not present. Thus, more heat is exchanged from the gas to the projection system wall 313a, and conversely less heat is exchanged from the gas to the substrate WA.

The presence of the mirror 28a to the right hand side of the opening 301 in FIG. 13 prevents the projection system wall 313b being provided with a raised portion and being provided with baffles. As a consequence of the absence of the baffles, a portion of the substrate WA which is to the right of the opening 301 may be heated by the gas more than a portion of the substrate which is to the left of the opening 301. Less expansion due to heating of the substrate may therefore take place at the portion of the substrates which is to the left of the opening 301 than at the portion which is to the right of the opening.

Figure 14:
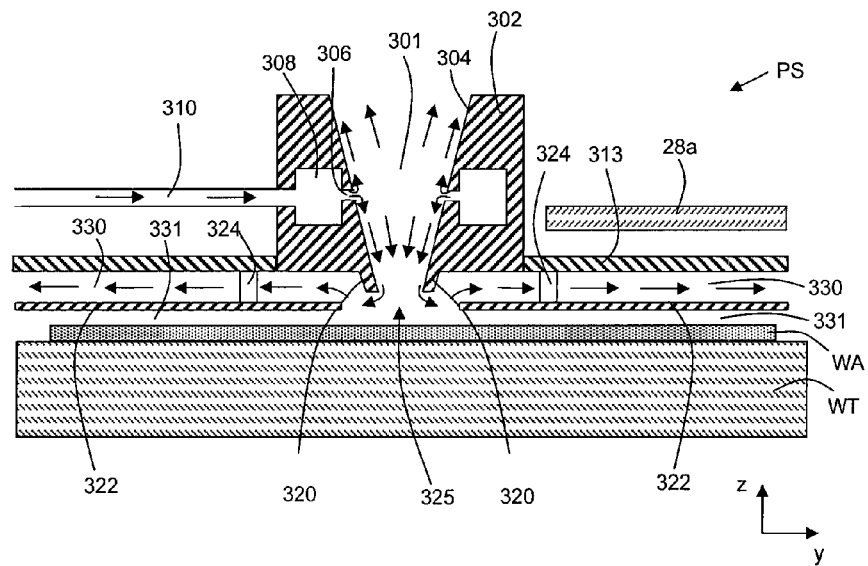
FIG. 14 schematically depicts part of the projection system and a substrate table of the lithographic apparatus according to an embodiment of the invention.

An embodiment of the invention is shown schematically in FIG. 14. The apparatus shown in FIG. 14 corresponds generally with that shown in FIG. 4 and corresponding reference numerals used for corresponding features of the apparatus. A plate is 322 is located beneath the wall 313 of the projection system. The plate 322 may be formed from aluminium, copper, silicon-infiltrated silicon carbide (SiSiC), or any other suitable thermally conducting material. The plate 322 is supported by supports 324 which extend downwardly from the projection system wall 313. The plate 322 is provided with a hole 325 at its center, the hole being large enough to encompass the bottom end of the opening 301. The plate 322 does not form part of the projection system wall 313, but instead is considered to be a separate entity which is connected to the projection system wall.

The plate 322 is positioned such that it is closer to the substrate WA than to the projection system wall 313 during operation of the lithographic apparatus. Thus, a gap 331 between the plate 322 and the substrate WA is smaller than a gap 330 between the plate and the projection system wall 313. Because the gap 330 between the plate 322 and the projection system wall 313 is larger than the gap 331 between the plate and the substrate WA, gas which has flowed out of the opening 301 will find it easiest to flow into the gap between the plate and the projection system wall. Therefore, more gas will flow into the gap 330 between the plate 322 and the projection system wall 313, and as a result less gas will flow in the gap 331 between the plate 322 and the substrate WA. As a result, less gas will interact with the surface of the substrate WA (compared with the case if the plate were not present). Consequently, unwanted heating of the substrate WA caused by the gas may be reduced.

The division of gas between the gap between the plate 322 and the projection system wall 313 (referred to here as the upper gap 330) and the gap between the plate 322 and the substrate WA (referred to here as the lower gap 331) is distributed approximately proportionally to the square of the size of the gap. Therefore, for example, if the ratio of the upper gap 330 to the lower gap 331 is 2:1 then the ratio of gas flow in the upper gap to the lower gap is 4:1. It may be desirable to reduce the flow of gas in the lower gap 331 to a minimum such that thermal effects caused by the gas are minimised. However, if the plate 322 is located too close to the substrate WA then there is a risk that the plate will come into contact with the substrate, causing damage to the substrate and/or the plate. In a given lithographic apparatus the position of the plate 322 may be selected based upon a trade-off between providing a desired clearance between the plate and the substrate WA and minimising the amount of gas which interacts with the substrate.

If the ratio of the upper gap to the lower gap is 1:1, then approximately 50% of the gas will flow in the lower gap 331 and may thus interact with the substrate WA. This may provide a reduction of the heat load applied to the substrate WA by the gas of the order of 50%. If the ratio of the upper gap 330 to the lower gap 331 is less than 1:1, then the reduction of the heat load applied to the substrate WA by the gas will be less than 50%. The reduction of the heat load will scale approximately proportionally with the flow rate of the gas, which scales as the square of the ratio of the gap sizes. Thus, if the ratio of the upper gap 330 to the lower gap 331 is for example 1:2, then approximately 80% of the gas will flow in the lower gap. Where this is the case, the plate 322 provides only a 20% reduction of the heat load applied to the wafer W. It may be, for example, that the overhead in terms of the cost of providing the plate 322 and the space desired in order to accommodate the plates is such that a reduction of the heat load by 20% is not sufficient to justify using the plate. For this reason, in an embodiment the ratio of the upper gap 330 to the lower gap 331 may be greater than 1:2. In an embodiment, the ratio of the upper gap 330 to the lower gap through 31 may be greater than or equal to 1:1.

The supports 324 which connect the plate 322 to the projection system wall 313 may be constructed from a thermally conducting material such as aluminium, copper, or silicon-infiltrated silicon carbide (SiSiC). This allows heat to be conducted from the plate 322 via the supports 324 to the projection system wall 313, thereby reducing the extent to which the temperature of the plate is increased by heating due to the gas. The plate 322 may include heat pipes (not shown) which are configured to conduct heat through the plate and thereby allow heat to dissipate through the plate.

Figure 15:
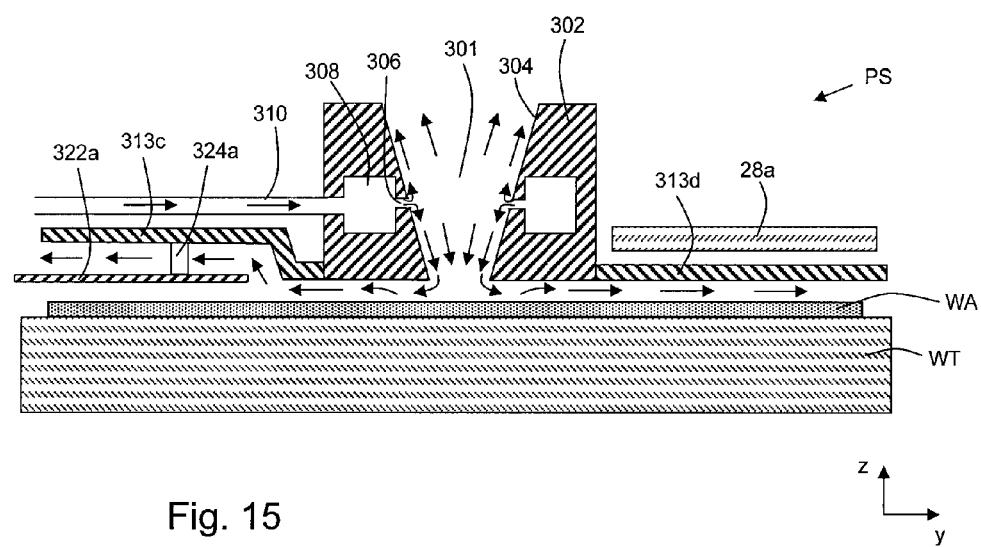
FIG. 15 schematically depicts part of the projection system and a substrate table of the lithographic apparatus according to an embodiment of the invention.

An embodiment of the invention is shown schematically in FIG. 15. FIG. 15 shows schematically a lithographic apparatus which corresponds in large part with the lithographic apparatus shown in FIG. 14. Features which correspond with features of the lithographic apparatus shown in FIG. 14 are provided with the same reference numerals. The protruding portion 320 is absent from the apparatus, and the substrate WA (and substrate table WT) is closer to the projection system wall than is the case in the apparatus shown in FIG. 14. The portion of the projection system wall 313c which is to the left of the opening 301 in FIG. 15 is raised such that the majority of the projection system wall has an increased separation from the substrate WA (and substrate table WT). The portion of the projection system wall 313d which is to the right of the opening 301 is not raised (it cannot be raised due to the presence of the mirror 28a).

A plate 322a is located beneath the raised portion of the projection system wall 313c. The plate 322a is supported by supports 324a which extend downwardly from the projection system wall 313c. The plate 322a has an inner end which is adjacent to the location at which the raised portion of the projection system wall 313c begins.

In use, a proportion of the gas which exits the hole 301 passes through a gap between the projection system wall 313c and the plate 322a. Since this gas is prevented from coming into contact with the substrate WA when it is travelling through that gap, heating of the substrate which would have been caused by the gas is avoided. Thus, the amount of heat which is exchanged from the gas to the substrate WA is reduced.

The presence of the mirror 28a to the right hand side of the opening 301 in FIG. 15 prevents the projection system wall 313d being provided with a raised portion and thus prevents a plate from being provided beneath that part of the projection system wall. As a consequence of the absence of a plate, a portion of the substrate WA which is to the right of the opening 301 may be heated by the gas more than a portion of the substrate which is to the left of the opening 301. Less expansion due to heating of the substrate may therefore take place at the portion of the substrates which is to the left of the opening 301 than at the portion which is to the right of the opening.

The projection system wall 313 may be formed from aluminium (or some other metal). One or more coatings may be provided on the projection system wall as described further above. Other parts of the lithographic apparatus may also be formed from aluminium (or some other metal).

In illustrated embodiments of the invention the opening defining wall 302 has been described as an entity which is separate from the projection system wall 313. However, the opening defining wall 302 may be considered to be part of the projection system wall. In particular, a lowermost surface of the opening defining wall 302 may be considered to be part of the projection system wall, and embodiments of the invention which have been described above as being applied to the projection system wall may include application to the lowermost surface of the opening defining wall. For example, the lowermost surface of the opening defining wall 302 may be roughened and/or may be provided with a structure, and/or may be provided with baffles, and/or may be provided with a porous coating. In this document, references to the projection system wall may be considered to include the lowermost surface of the opening defining wall (where the context allows).

Although the embodiments shown in FIGS. 4 and 14 include a protruding portion 320, the protruding portion is not necessary and may be omitted. Similarly, although no protruding portion is shown in FIGS. 13 and 15, a protruding portion may be provided.

Illustrated embodiments of the invention include a opening defining wall 302 which has a sloping inner surface 304 that is substantially matched to the shape of the EUV radiation beam. This conical shape may provide the advantage that it gives good contamination suppression without blocking the EUV radiation beam. However, it is not essential that embodiments of the invention include a cone shaped wall, and embodiments of the invention may have a wall which has some other shape.

References to a conventional component surface may be construed as referring to a component surface which has not been roughened, provided with a structured surface or provided with a coating arranged to increase the thermal accommodation coefficient of the component surface. The conventional component surface may for example be a projection system wall formed from metal (e.g. aluminium) which has been milled or cut in a conventional manner Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
a substrate table constructed to hold a substrate; and
a projection system configured to project a patterned radiation beam onto a target portion of the substrate;
wherein a surface of a component of the lithographic apparatus in a vacuum environment, in use, is provided with a repeating structure configured to increase the effective thermal accommodation coefficient of the surface, the component selected from the group consisting of a wall of the projection system, a mirror, a heat sink and an internal chamber wall, wherein the repeating structure comprises a series of ridges.

2. A lithographic apparatus component having a surface provided with a structure that satisfies:

$$\frac{f^{2.04}}{1+0.47\cdot R^{-1.96}} > 0.05,$$

wherein f is the fraction of the structure that is occupied by space, and R is the depth of the structure divided by the width of the structure.

3. The lithographic apparatus component of claim 2, wherein the structure has an aspect ratio in excess of 0.2.

4. The lithographic apparatus component of claim 2, wherein the structure is a repeating structure.

5. The lithographic apparatus component of claim 4, wherein the repeating structure comprises a series of ridges.

6. The lithographic apparatus component of claim 4, wherein the repeating structure comprises an array of holes provided in the surface of the component.

7. The lithographic apparatus component of claim 6, wherein the array of holes comprises a honeycomb arrangement or an array of circular holes.

8. The lithographic apparatus component of claim 4, wherein the repeating structure has a constant pitch.

9. The lithographic apparatus component of claim 2, wherein the structure is a non-repeating structure, and wherein f and R are average values for the structure.

10. The lithographic apparatus component of claim 2, wherein the lithographic apparatus component is a projection system wall, a substrate table, a mirror, a heat sink or an internal chamber wall.

11. A lithographic apparatus component having a surface provided with a structure, the surface having an effective thermal accommodation coefficient of 0.4 or greater for hydrogen gas.

12. The lithographic apparatus component of claim 11, wherein the structure is a repeating structure.

13. The lithographic apparatus component of claim 12, wherein the repeating structure comprises a series of ridges.

14. The lithographic apparatus component of claim 12, wherein the repeating structure comprises an array of holes provided in the surface of the component.

15. The lithographic apparatus component of claim 14, wherein the array of holes comprises a honeycomb arrangement or an array of circular holes.

16. The lithographic apparatus component of claim 12, wherein the repeating structure has a constant pitch.

17. The lithographic apparatus component of claim 11, wherein the lithographic apparatus component is a projection system wall, a substrate table, a mirror, a heat sink or an internal chamber wall.

18. A lithographic apparatus component having an exposed surface to a vacuum environment, in use, the exposed surface provided with a repeating structure that has a surface area per unit of projected two-dimensional area that is greater than the surface area per unit of projected two-dimensional area of a conventional surface of the component without the repeating structure, wherein the lithographic apparatus component is selected from the group consisting of a projection system wall, a mirror, a heat sink and an internal chamber wall, wherein the repeating structure comprises a series of ridges.

19. The lithographic apparatus component of claim 18, wherein the repeating structure has a constant pitch.

* * * * *